United States Patent
Kohl et al.

(10) Patent No.: US 8,405,170 B2
(45) Date of Patent: Mar. 26, 2013

(54) PACKAGING FOR MICRO ELECTRO-MECHANICAL SYSTEMS AND METHODS OF FABRICATING THEREOF

(75) Inventors: Paul A. Kohl, Atlanta, GA (US); Farrokh Ayazi, Atlanta, GA (US); Paul J. Joseph, Lawrenceville, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 12/797,649

(22) Filed: Jun. 10, 2010

(65) Prior Publication Data
US 2010/0307786 A1    Dec. 9, 2010

Related U.S. Application Data

(63) Continuation of application No. 10/534,956, filed as application No. PCT/US2005/008664 on Mar. 15, 2005.

(60) Provisional application No. 60/553,178, filed on Mar. 15, 2004.

(51) Int. Cl.
*H01L 29/84* (2006.01)

(52) U.S. Cl. ............... 257/415; 257/414; 257/416

(58) Field of Classification Search .......... 257/414–420, 257/E21.511, E33.056
See application file for complete search history.

(56) References Cited

U.S. PATENT DOCUMENTS

| | | | |
|---|---|---|---|
| 3,639,928 A | 2/1972 | Bentley et al. | |
| 6,136,212 A * | 10/2000 | Mastrangelo et al. | 216/49 |
| 6,596,236 B2 | 7/2003 | DiMeo et al. | |
| 6,617,657 B1 | 9/2003 | Yao et al. | |
| 6,803,637 B2 | 10/2004 | Benzel et al. | |
| 6,936,491 B2 | 8/2005 | Partridge et al. | |
| 6,936,494 B2 | 8/2005 | Cheung | |
| 6,953,985 B2 | 10/2005 | Lin et al. | |
| 7,008,812 B1 * | 3/2006 | Carley | 438/52 |
| 7,078,796 B2 | 7/2006 | Dunn et al. | |
| 2002/0136481 A1 * | 9/2002 | Mule' et al. | 385/14 |
| 2003/0116813 A1 * | 6/2003 | Benzel et al. | 257/414 |
| 2003/0122227 A1 * | 7/2003 | Silverbrook | 257/678 |
| 2003/0155643 A1 | 8/2003 | Freidhoff | |
| 2003/0183916 A1 * | 10/2003 | Heck et al. | 257/684 |
| 2003/0211644 A1 * | 11/2003 | Boroson et al. | 438/26 |
| 2004/0005258 A1 | 1/2004 | Fonash et al. | |
| 2004/0137728 A1 | 7/2004 | Gallagher et al. | |
| 2004/0245586 A1 | 12/2004 | Partridge et al. | |
| 2006/0014374 A1 * | 1/2006 | Barth et al. | 438/622 |
| 2006/0077156 A1 * | 4/2006 | Chui et al. | 345/85 |
| 2007/0158787 A1 | 7/2007 | Chanchani | |

OTHER PUBLICATIONS

Sorption Behavior of an Aliphatic Series of Aldehydes in the Presence of Poly(ethylene terephthalate) Blends Containing Aldehyde Scavenging Agents, Dissertation of Eric C. Suloff, Nov. 22, 2002; Front-Matters pp. i-xv; and Chapter 4. Permeability, Diffusivity, and Solubility of Gas and Solute Through Polymers, pp. 29-99.
Permeabilty of noble gases through Kapton, butyl, nylon, and "Silver Shield," Schowalter et.al., Nuclear Instruments and Methods in Physics Research A, 615 (2010) pp. 267-271.

(Continued)

*Primary Examiner* — Cuong Q Nguyen
*Assistant Examiner* — Yosef Gebreyesus
(74) *Attorney, Agent, or Firm* — Bernard Berman; Balaram Gupta

(57) ABSTRACT

Embodiments of the present disclosure provide systems and methods for producing micro electro-mechanical device packages. Briefly described, in architecture, one embodiment of the system, among others, includes a micro electro-mechanical device formed on a substrate layer; and a thermally decomposable sacrificial structure protecting at least a portion of the micro electro-mechanical device, where the sacrificial structure is formed on the substrate layer and surrounds a gas cavity enclosing an active surface of the micro electro-mechanical device. Other systems and methods are also provided.

23 Claims, 14 Drawing Sheets

OTHER PUBLICATIONS

Permeation through Plastic Films, Long, AIChE Journal, vol. 15, Jan. 1969, No. 1, pp. 73-80.
TEFLON Nonstick & Industrial Coatings, TEFLON Finishes in the Chemical Processing Industry, Permeation—Its Effects on TEFLON Fluoropolymer Coatings, Technical Information Bulletin of DuPont, RWJ68, Reorder No. H 88495, Jan. 2001, pp. 1-12.
International Search Report.

* cited by examiner

PACKAGING FOR MICRO ELECTRO-MECHANICAL SYSTEMS AND METHODS OF FABRICATING THEREOF

CROSS-REFERENCE TO RELATED APPLICATION

This application is a continuation of, is entitled to and claims priority under 35 U.S.C. §120 to U.S. nonprovisional patent application Ser. No. 10/534,956, filed Mar. 15, 2005 under the PCT and Apr. 27, 2007 as a national filing in the U.S., which is entitled to and claims priority to U.S. provisional patent application entitled, "Hermetic Packaging for MEMS," having Ser. No. 60/553,178, filed Mar. 15, 2004, which are both incorporated herein by reference in their entirety.

TECHNICAL FIELD

The present disclosure is generally related to micro electro-mechanical devices and, more particularly, is related to packaging of micro electro-mechanical devices.

BACKGROUND

Adapting microelectronic packages to micro electro-mechanical system (MEMS) devices involves several challenging packaging requirements. The typical three-dimensional and moving elements of many MEMS devices generally require some sort of cavity package to provide free space above the active surface of the MEMS device. The interior of the cavity must generally be free of contaminants, including excessive outgassing of materials. The MEMS device might also require thermal isolation within the package, and a mounting method that minimizes mechanical stress on the device. The cavity may be evacuated or be filled with atmosphere-controlling agents such as getters.

In addition to these requirements, MEMS devices are vulnerable to damage during what would otherwise be normal micropackaging procedures. The presence of three-dimensional mechanical structures that can move adds fragility to unpackaged MEMS devices. For example, movable MEMS structures make contact and permanently stick together (stiction effect) if roughly handled.

Further, the cost of MEMS packaging has become a critical issue for many applications. For instance, 50-90% of the cost in producing most MEMS devices is spent in packaging the MEMS devices. For instance, the surface features and cavity requirements of MEMS devices typically prohibit application of low-cost transfer-molded plastic packaging used for most integrated circuits. Moreover, common encapsulation techniques such as injection molding, often require high pressures that may easily damage microstructures.

Thus, a heretofore unaddressed need exists in the industry to address the aforementioned deficiencies and inadequacies.

SUMMARY

Embodiments of the present disclosure provide systems and methods for producing micro electro-mechanical device packages. Briefly described, in architecture, one embodiment of the system, among others, includes a micro electro-mechanical device formed on a substrate layer; and a thermally decomposable sacrificial structure protecting at least a portion of the micro electro-mechanical device, where the sacrificial structure is formed on the substrate layer and surrounds a gas cavity enclosing an active surface of the micro electro-mechanical device.

Embodiments of the present disclosure can also be viewed as providing methods for producing micro electro-mechanical device packages. In this regard, one embodiment of such a method, among others, can be broadly summarized by the following steps: forming a thermally decomposable sacrificial layer on a substrate of a micro electro-mechanical device, where the sacrificial layer surrounds a gas cavity encapsulating a portion of the micro electro-mechanical device; forming a protective layer around the sacrificial layer; and thermally decomposing the sacrificial layer, where decomposed molecules permeate through the protective layer and a gas cavity is formed where the thermally decomposable sacrificial layer was formed.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

Figure 1:
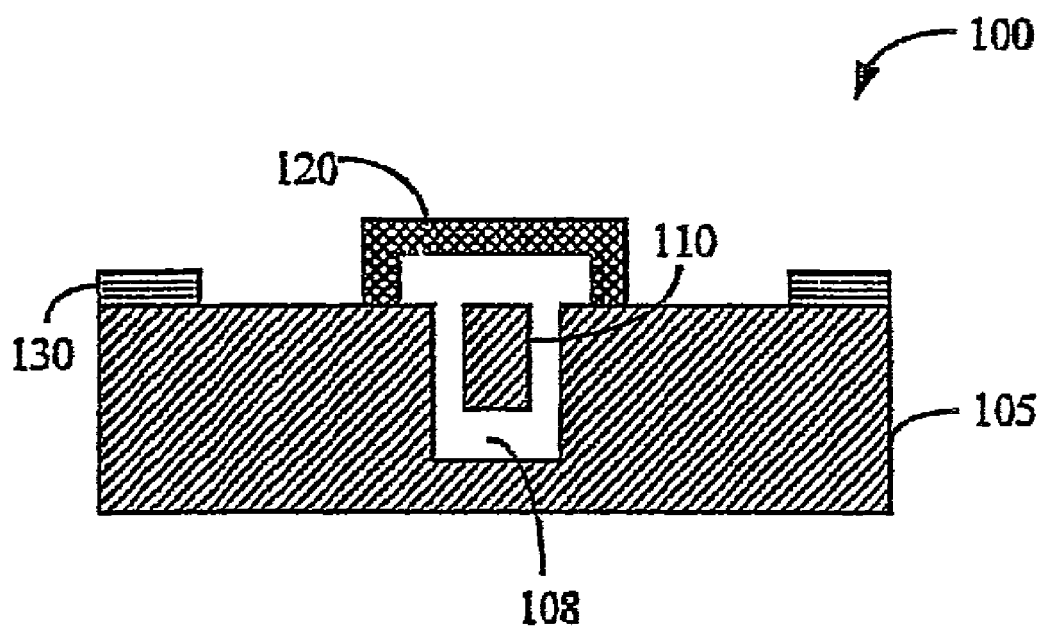
FIG. 1 is a diagram of a MEMS package in accordance with one embodiment of the present disclosure.

FIG. 1 shows a MEMS device package 100 in accordance with one embodiment of the present disclosure. Accordingly, the MEMS device package 100 is used to package a freestanding MEMS structure 110 and generally includes a substrate layer 105, one or more MEMS structure(s) 110 formed on the substrate layer 105; a cavity or air gap or gas cavity 108 surrounding the freestanding MEMS structure 110; a barrier layer 120 around the cavity 108 to provide mechanical, electrical, chemical, and/or environmental protection for the MEMS device; a plurality of electrical feedthroughs extending from inside of the cavity to the outside (through or under the barrier layer 120, to guide electrical signals from outside to inside); and contacts 130 formed on the substrate 105 for connecting the package 100 to external points or terminals. After packaging the freestanding or released MEMS structure 110 in a MEMS package 100, the package 100 may then be attached to a circuit board or system in a variety of unique and different approaches, as is discussed hereinafter.

Substrate layer 105 can be made of materials appropriate for a particular MEMS system or device. Exemplar materials include, but are not limited to, glasses, diamond, quartz, sapphire, silicon, silicon compounds, germanium, germanium compounds, gallium, gallium compounds, indium, indium compounds, or other semiconductor materials and/or compounds. In addition, substrate layer 105 can include non-semiconductor substrate materials, including any dielectric materials, metals (e.g., copper and aluminum), or ceramics or organic materials found in printed wiring boards, for example. The contacts 130 are formed from conductors such as metals and/or metal alloys, subject to appropriate considerations such as adhesion and thermal properties.

As previously stated, the barrier layer 120 around the cavity 108 provides mechanical, electrical, chemical, and/or environmental protection for the MEMS device(s). Depending on the particular MEMS device or the particular application, different levels of protection may be desired. Generally, the air gap or cavity is an enclosed region containing a gas that is not necessarily breathing air and in some embodiments, the air gap is under vacuum conditions. The air gap or cavity is generally enclosed by a super structure.

Generally, the MEMS structure 110 is packaged to ensure protection of the device from the working environment and protection of the environment from device material and operation. For example, one level of protection provides protection from interference from other mechanical structure or objects to ensure structural integrity of the MEMS structure 110. In this type of enclosure, the barrier layer 120 should be made of a material that can withstand the general rigors of a particular operating environment of a MEMS device. Another additional level of protection may further provide protection from exposure to oxygen or water (e.g., a hermetic enclosure). Accordingly, for this type of protection, the barrier layer 120 is generally made of a metal material that provides an airtight seal around the air cavity 108. In addition, some barrier levels 120 may also provide an additional level of protection which further provides protection from exposure to any outside gases. For this last level of protection, a vacuum is produced inside the air cavity 108 and the barrier layer 120 is generally made of a metal material that maintains the vacuum inside the air cavity 108.

Figure 2:
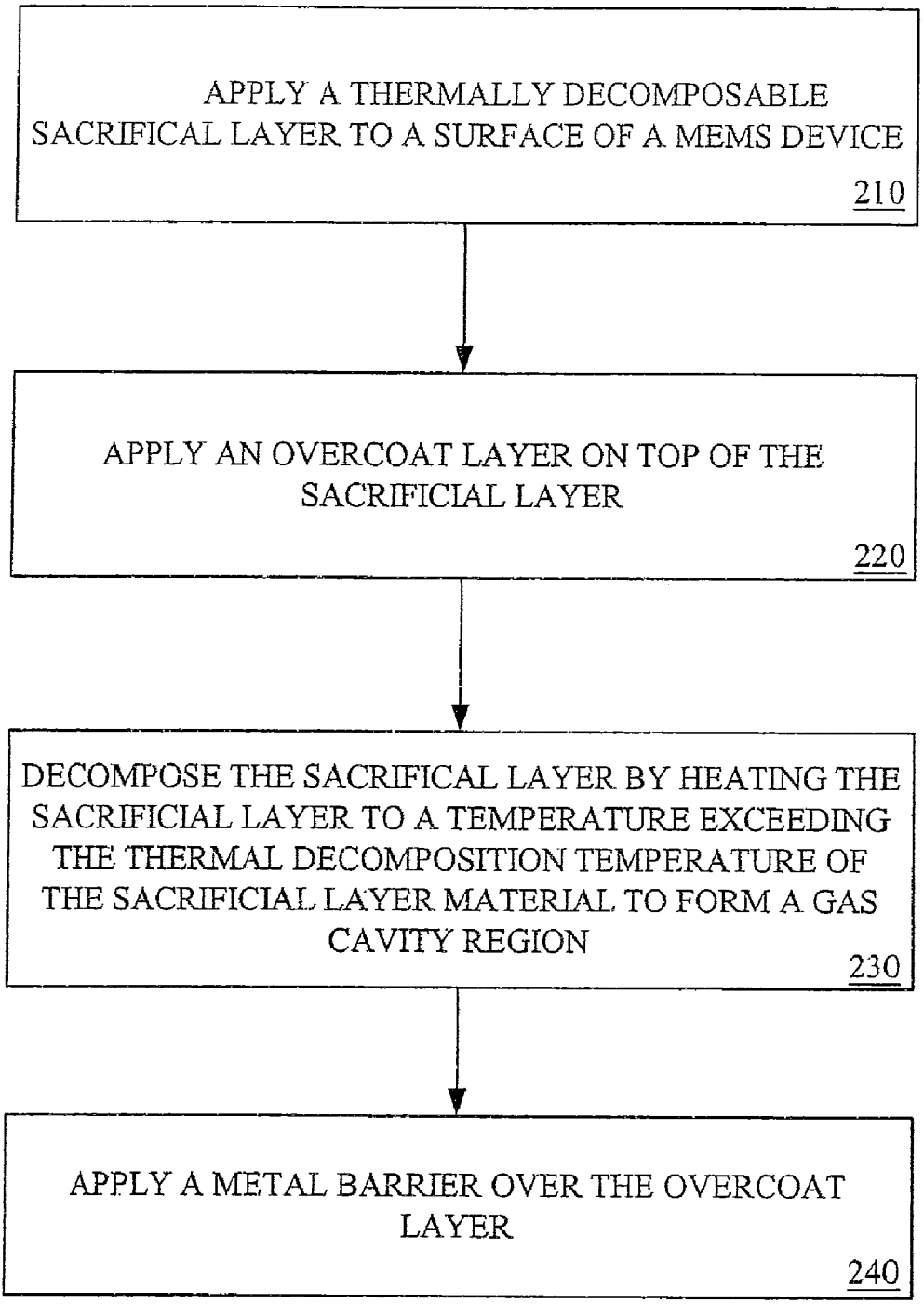
FIG. 2 is a flowchart diagram describing an illustrative process for fabricating the MEMS package of FIG. 1.
Figure 3:
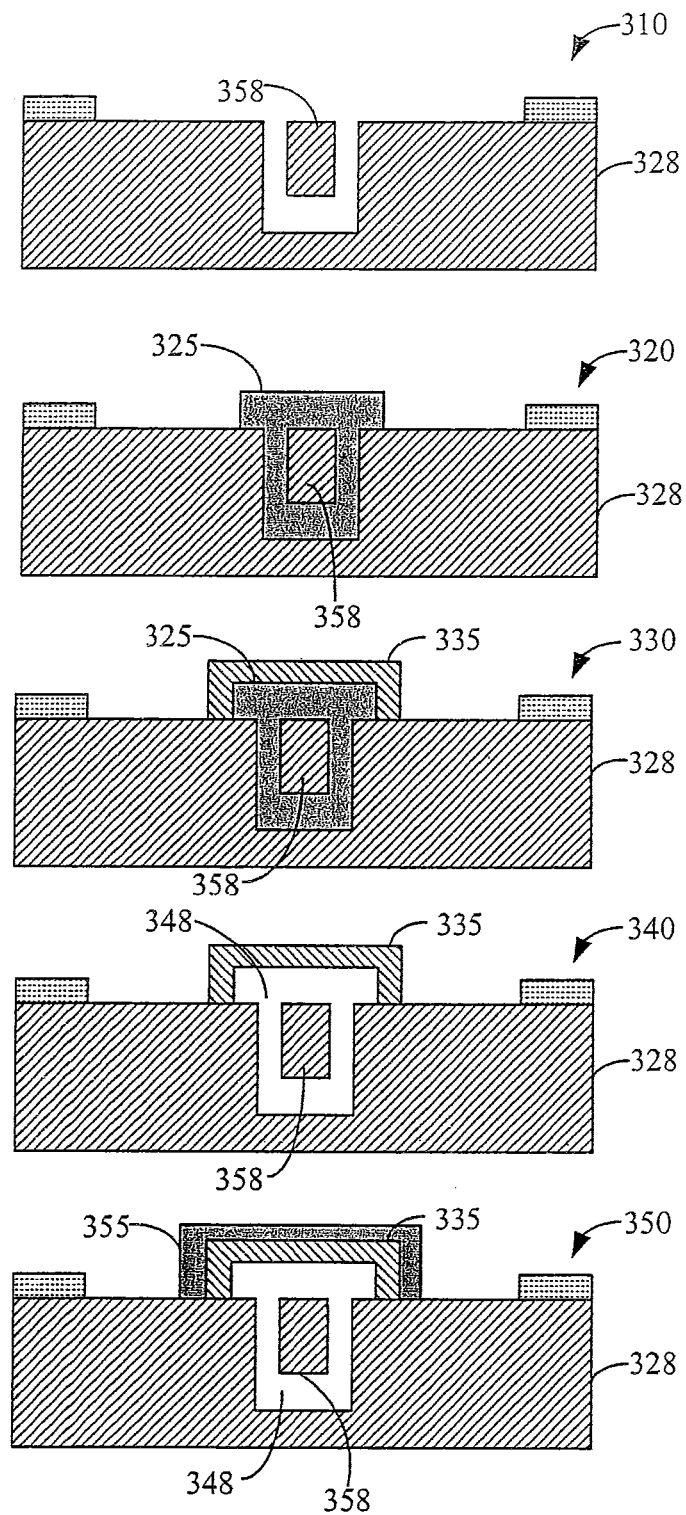
FIG. 3 is a diagram showing the fabrication steps in the process of FIG. 2.

In accordance with one embodiment of the present disclosure, a process 200 for fabricating the MEMS device package 100 is discussed with regard to FIG. 2 and FIG. 3. This process 200 is based upon thermal decomposition of a sacrificial material, as described herein. It should be noted that for clarity, some portions of the fabrication process are not included in FIG. 2. As such, the following fabrication process is not intended to be an exhaustive list that includes all steps required for fabricating the MEMS device package 100. In addition, the fabrication process is flexible because the process steps may be performed in a different order than the order illustrated in FIG. 2 or some steps may be performed simultaneously.

Referring now to FIGS. 2 and 3, a thermally decomposable sacrificial polymer (e.g., Unity 200, Promerus, LLC, Brecksville, Ohio) is applied (210) to the surface of a released MEMS device 310 to produce a MEMS device package 320 having a sacrificial layer 325. Sacrificial polymer material is patterned so as to encapsulate the surface or portions of the surface of the MEMS device 310 to produce the sacrificial layer 325. For example, a photosensitive or photodefinable sacrificial polymer material may be used to make the sacrificial layer 325. Accordingly, the photodefinable polymer can be deposited onto the substrate 328 using techniques such as, for example, spin-coating, doctor-blading, sputtering, lamination, screen or stencil-printing, melt dispensing, chemical vapor deposition (CVD), and plasma-based deposition systems.

Then, after patterning with the sacrificial material 325, the MEMS device is overcoated with a dielectric material (e.g., Avatrel®, Polyimide, SU8) 335 on top of the sacrificial layer 325 and any other desired areas on the MEMS structure. As such, the overcoat layer is applied (220) to the MEMS structure 320 to produce the MEMS device package 330 having sacrificial layer 325 and overcoat layer 335. The overcoat layer 335 can be deposited onto the substrate 328 using techniques such as, for example, spin coating, photo-defining methods, doctor-blading, sputtering, lamination, screen or stencil-printing, melt dispensing, chemical vapor deposition (CVD), and plasma-based deposition systems. The overcoat materials can also be patterned to expose features, such as bond pads or contacts.

After the overcoat 335 is prepared, the sacrificial layer 325 is decomposed by beating the sacrificial polymer material of the sacrificial layer 325 to a temperature sufficient to decompose the polymer (e.g., 200-250° C.). For example, the sacrificial layer 325 may be decomposed (230) in an oven by exceeding the thermal decomposition temperature of the sacrificial layer 325 to produce a MEMS device package 340 having a substantially residue-free, low-residue air gap, or a residue-free cavity 348 surrounded by Overcoat layer 335. Residues below a "substantial" value have little or no effect on the final product and can be considered "residue free." For example, in MEMS devices, residues less than 10 nm typically have no effect on the end-product and are considered residue free.

During this process, the decomposition products of the sacrificial layer 325 diffuse or permeate through the overcoat layer 335. In an additional step, additional metal material 355 is added (240) to the MEMS structure over the overcoat layer 335 (e.g., via sputtering and patterning the metal material) to produce a MEMS device package 350 with a metal cap or barrier 355 protecting an active surface 358 of a MEMS device. The metal barrier 355 provides one type of protection for the MEMS device 310 from external forces or elements. In particular, metals are known to provide a hermetic barrier.

Therefore, the metal hermetic barrier 355 allows the MEMS device to be brought into ambient conditions.

In some embodiments, vacuum packaging of a MEMS device is desired. One embodiment, among others, for implementing vacuum packaging of a MEMS device employs the previously described process 200. However, to add the additional metal material in step 335, the MEMS device 340 is placed in a vacuum chamber, such as in an evaporator, and air within the air cavity region 348 is evacuated. While under vacuum, metal is then deposited over the overcoat material, as previously described in step 255. The metal barrier 355 prevents air from entering the region encapsulated by metal, thus providing a vacuum package for the MEMS device. Note, in some embodiments, the step for removing the sacrificial layer may also be performed in a vacuum chamber such that multiple steps may then be performed simultaneously.

Further note, that in some embodiments, a MFMS package is produced without undergoing each of the aforementioned steps of FIG. 2 and is still readily suitable for further processing in order to provide electrical connections to external points or terminals, as is discussed hereinafter.

A sacrificial polymer used to produce the sacrificial layer 325 can be a polymer that slowly decomposes and does not produce undue pressure build-up while forming the air cavity region 348 within the surrounding materials. In addition, the decomposition of the sacrificial polymer produces gas molecules small enough to permeate the overcoat layer 335. Further, the sacrificial polymer has a decomposition temperature less than the decomposition or degradation temperature of the MEMS structure and overcoat material. Still further, the sacrificial material should have a decomposition temperature above the deposition or curing temperature of an overcoat material but less than the degradation temperature of the components in the structure in which the sacrificial polymer is being used.

The sacrificial polymer can include compounds such as, but not limited to, polynorbornenes, polycarbonates, polyethers, polyesters, functionalized compounds of each, and combinations thereof. The polynorbornene can include, but is not limited to, alkenyl-substituted norbornene (e.g., cycloacrylate norbornene). The polycarbonate can include, but is not limited to, norbornene carbonate, polypropylene carbonate, polyethylene carbonate, polycyclohexene carbonate, and combinations thereof.

In addition, the sacrificial polymer can include additional components that alter the processability (e.g., increase or decrease the stability of the sacrificial polymer to thermal and/or light radiation) of the sacrificial polymer. In this regard, the components can include, but are not limited to, photoinitiators and photoacid initiators.

Embodiments of the disclosed sacrificial composition include, but are not limited to, a sacrificial polymer and one or more positive tone or negative tone component. The positive tone component can include a photoacid generator.

For example, the sacrificial component can include either a negative tone component and/or a positive tone component. The negative tone component can include compounds that generate a reactant that would cause the crosslinking in the sacrificial polymer. The negative tone component can include compounds, such as, but not limited to, a photosensitive free radical generator. Alternative negative tone components can be used, such as photoacid generators (e.g., in epoxide-functionalized systems).

A negative tone photosensitive free radical generator is a compound which, when exposed to light breaks into two or more compounds, at least one of which is a free radical. In particular, the negative tone photoinitiator can include, but is not limited to, bis(2,4,6-trimethylbenzoyl)-phenylphosphineoxide (Irgacure 819, Ciba Specialty Chemicals Inc.); 2-benzyl-2-dimethylamino-1-(4-morpholinophenyl)-butanone-1 (Irgacure 369, Ciba); 2,2-dimethoxy-1,2-diphenylethan-1-one (Irgacure 651, Ciba); 2-methyl-1[4-(methylthio)-phenyl]-2-morpholinopropan-1-one (Irgacure 907, Ciba); benzoin ethyl ether (BEE, Aldrich); 2-methyl-4'-(methylthio)-2-morpholino-propiophenone; 2,2'-dimethoxy-2-phenylacetophenone (Irgacure 1300, Ciba); 2,6-bis(4-azidobenzylidene)-4-ethylcyclohexanone (BAC-E), and combinations thereof.

The positive tone components can include, but is not limited to, photoacid generator(s). More specifically, the positive tone photoacid generator can include, but is not limited to, nucleophilic halogenides (e.g., diphenyliodonium salt, diphenylfluoronium salt) and complex metal halide anions (e.g., triphenylsulphonium salts). In particular, the photoacid generator can be tetrakis(pentafluorophenyl)borate-4-methylphenyl[4-(1-methylethyl)phenyl]-iodonium (DPI-TPFPB); tris(4-t-butylphenyl)sulfonium tetrakis-(pentafluorophenyl)borate (TTBPS-TPFPB); tris(4-t-butylphenyl) sulfonium hexafluorophosphate (TTBPS-HFP); triphenylsulfonium triflate (TPS-Tf); bis(4-tert-butylphenyl) iodonium triflate (DTBPI-Tf); triazine (TAZ-101); triphenylsulfonium hexafluoroantimonate (TPS-103); Rhodosil™ Photoinitiator 2074 (FABA); triphenylsulfonium bis(perfluoromethanesulfonyl) imide (TPS-N1); di-(p-t-butyl) phenyliodonium bis(perfluoromethanesulfonyl) imide (DTBPI-N1); triphenylsulfonium; tris(perfluoromethanesulfonyl) methide (TPS-C1); di-(p-t-butylphenyl)iodonium tris(perfluoromethanesulfonyl)methide (DTBPI-C1); and combinations thereof.

The photoacid generator can be from about 0.5% to 5% by weight of the sacrificial composition. In particular, the photoacid generator can be from about 1% to 3% by weight of the sacrificial composition.

The remaining percentage of the sacrificial composition not accounted for in the photoacid generator and sacrificial polymer (e.g., from about 50% to about 99%) can be made up with solvent, such as, but not limited to, mesitylene, N-methyl-2-pyrrolidinone, propylene carbonate, anisole, cyclohexanone, propyleneglycol monomethyl ether acetate, N-butyl acetate, diglyme, ethyl 3-ethoxypropionate, and combinations thereof.

The thermal decomposition of the sacrificial polymer can be performed by heating the MEMS device package to the decomposition temperature of the sacrificial polymer and holding at that temperature for a certain period of time (e.g., 1-2 hours). Thereafter, the decomposition products diffuse or permeate through the overcoat polymer layer leaving a virtually residue-free hollow structure (air cavity).

The overcoat layer 335 can be any modular polymer or deposited film (e.g. silicon dioxide, silicon nitride, etc.) that includes the characteristic of being permeable or semi-permeable to the decomposition gases produced by the decomposition of a sacrificial polymer while forming the air gap or cavity. In addition, the overcoat polymer layer has elastic properties so as to not rupture or collapse under fabrication and use conditions. Further, the overcoat layer 335 is stable in the temperature range in which the sacrificial polymer decomposes. Examples of the overcoat layer 335 include compounds such as, for example, polyimides, polynorbornenes, epoxides, polyarylenes ethers, and parylenes. More specifically, the overcoat layer 335 includes compounds such as Amoco Ultradel™ 7501, BF Goodrich Avatrel® Dielectric Polymer, DuPont 2611, DuPont 2734, DuPont 2771, and DuPont 2555. The overcoat layer 335 can be deposited on the substrate using techniques such as, for example, spin coating, doctor-blading, sputtering, lamination, screen or stencil-printing, chemical vapor deposition (CVD), plasma based deposition systems, etc.

Figure 4:
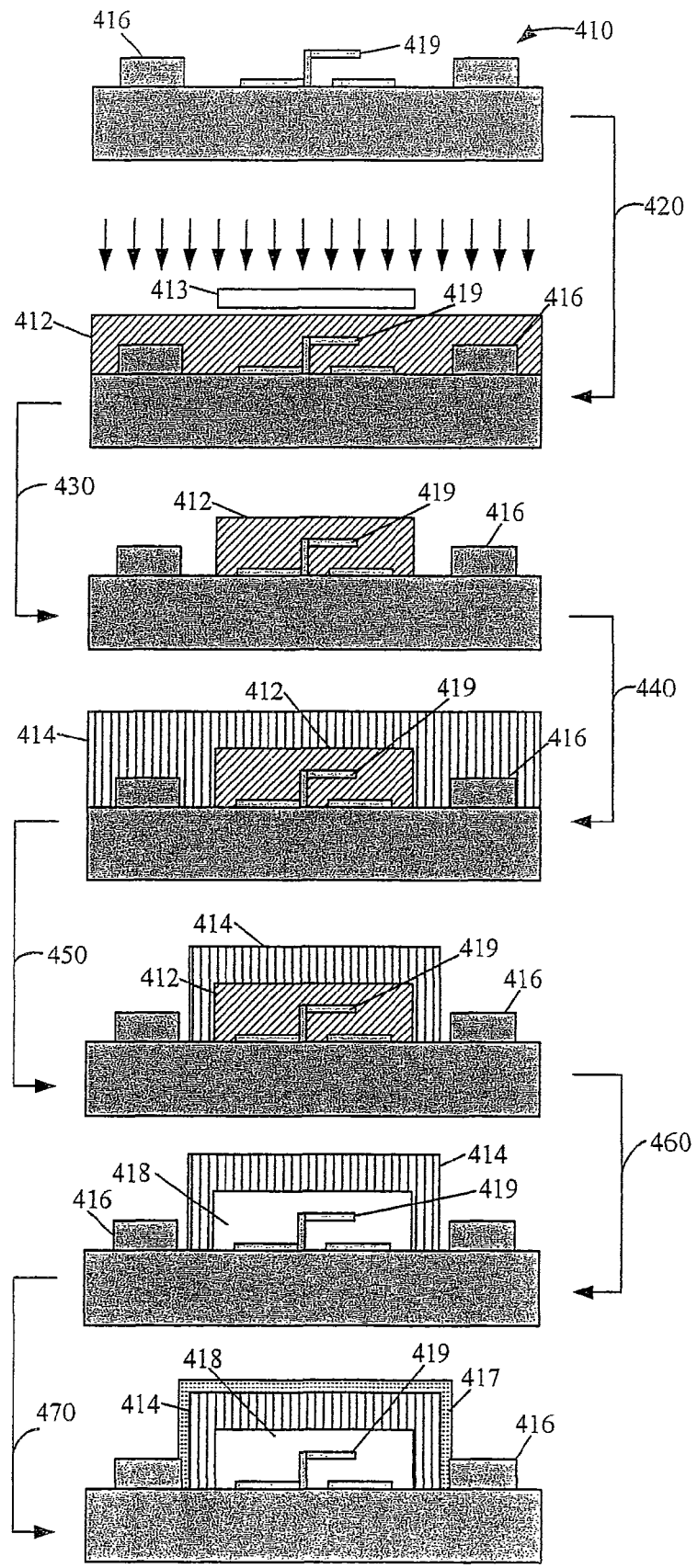
FIG. 4 is a diagram describing one embodiment of a process for performing the step of applying a sacrificial layer as performed in FIG. 2.
Figure 5:
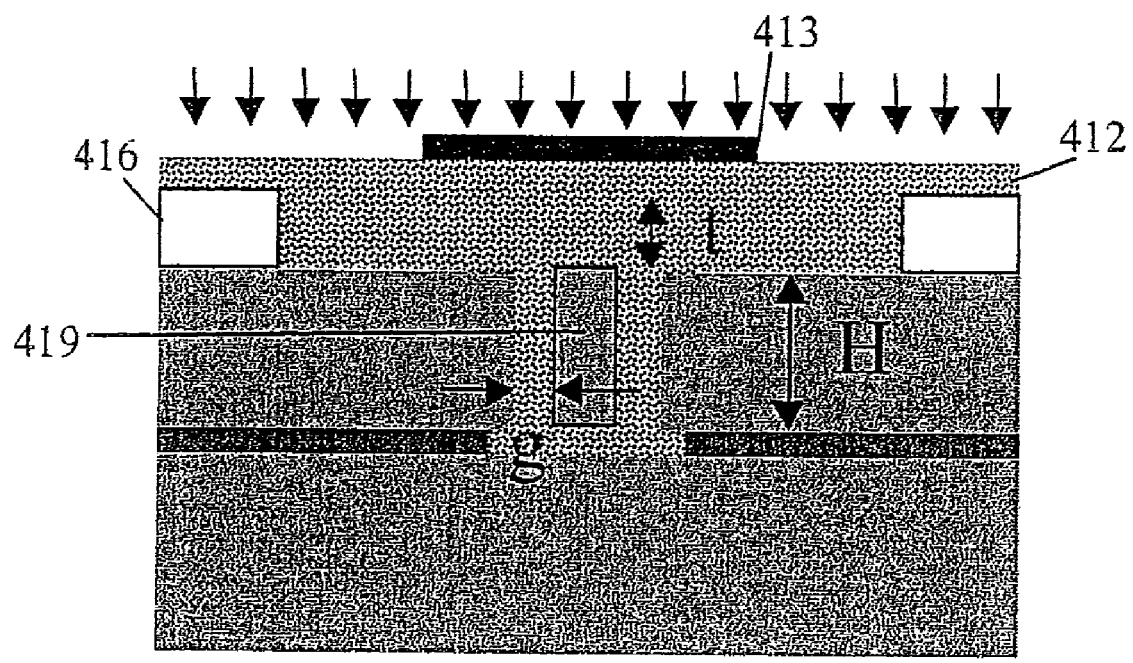
FIG. 5 is a diagram shown an embodiment of a MEMS device that is suited for the process of FIG. 4.

A variety of approaches may be used to apply the thermally decomposable sacrificial layer and overcoat layer to a MEMS device. As such, FIG. 4 shows a diagram describing one such process this is aptly suited for packaging surface micromachined MEMS devices such as silicon on insulator (SOI) resonators or other MEMS devices with small holes (e.g., H>>g and t<<50 μm, where H is height of air cavity; g is width of hole; and t is thickness of sacrificial layer), as represented by FIG. 5.

In this packaging via patterning (PVP) approach, a photo-definable sacrificial polymer Unity 200 (Promerus, LLC, Brecksville, Ohio) is first spin-coated on the surface of a MEMS device 410 to produce a thin sacrificial layer 412, and the MEMS device is soft-baked (420). Then, deep UV exposure (λ=248 nm) is performed (420) to pattern the thin sacrificial layer 412. The sacrificial layer 412 is bake-developed (430) at about 110° C. to decompose the exposed area, followed by encapsulation (440) of the sacrificial material using a photo-definable polymer overcoat Avatrel (Promerus, LLC) 414.

After the encapsulation (440), the bond pads 416 are opened via photo-patterning (450) of the overcoat material 414. The sacrificial material under the overcoat that covers the MEMS structure is then thermally decomposed (460) at about 200-300° C. to create an air-cavity 418. This is the highest temperature step in this process. The by-products of thermal decomposition can easily diffuse out of the cavity 418 through the overcoat 414. An aluminum layer 417 can be sputtered (470) to hermetically seal the packaged MEMS device.

After decomposition of the sacrificial material, the inside of the cavity 418 is clean of sacrificial material, and the device structure 419 is intact and free to move without any residue on the device. For example in one experimental trial, a 25 μm thick SOI beam resonator (2.6 MHz frequency) with a 1 μm gap was packaged via PVP with a Unity sacrificial material. The Unity sacrificial material is a photo-definable polycarbonate that has good adhesion to silicon, oxide, and metals and is thermally decomposable at low temperatures. Moreover, the Unity sacrificial material is characterized by clean decomposition in a narrow temperature range. In this trial, the Q-factor (Q=8000) did not change for this device after packaging and removal of the sacrificial material.

Figure 6:
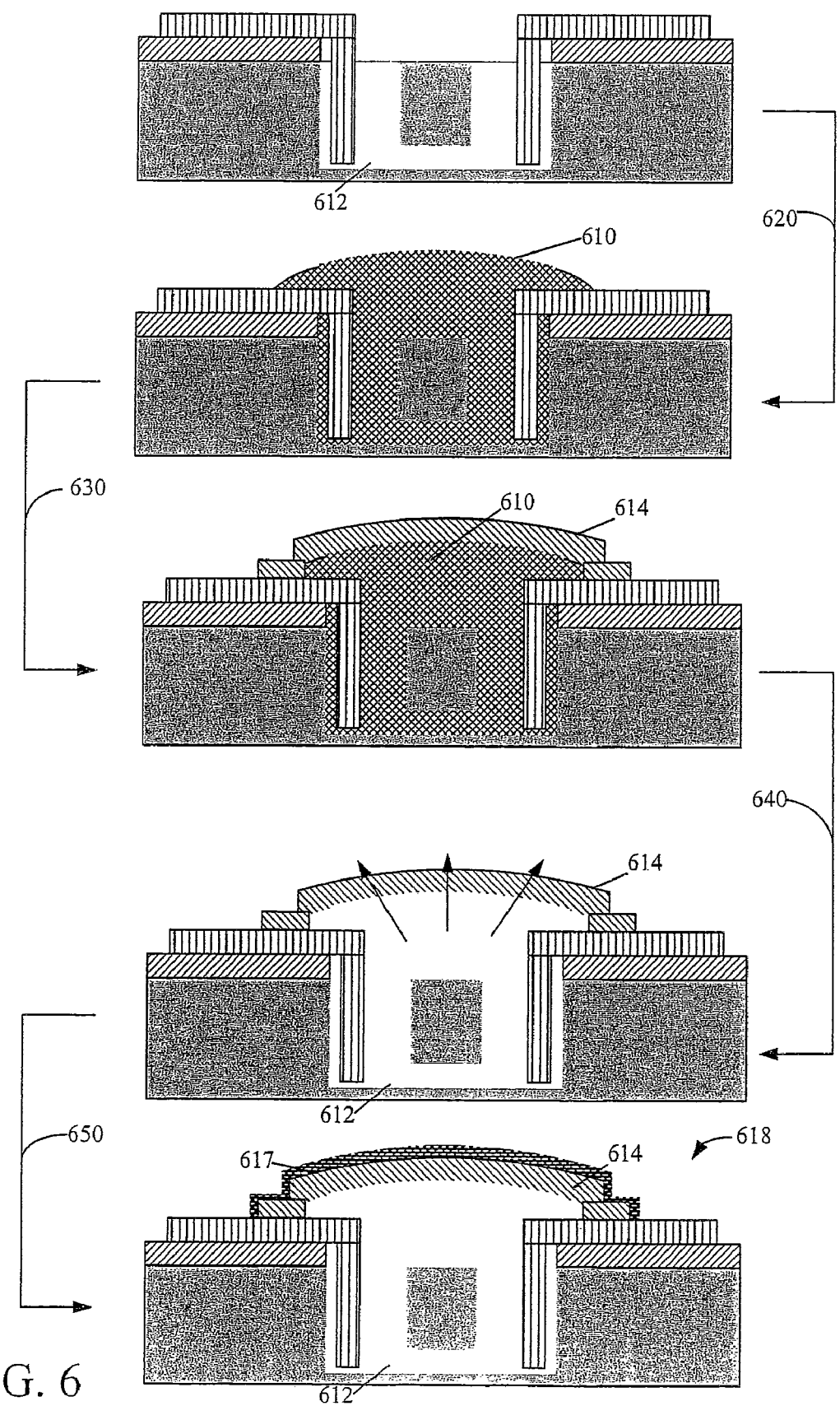
FIG. 6 is a diagram describing one embodiment of a process for performing the step of applying a sacrificial layer as performed in FIG. 2.
Figure 7:
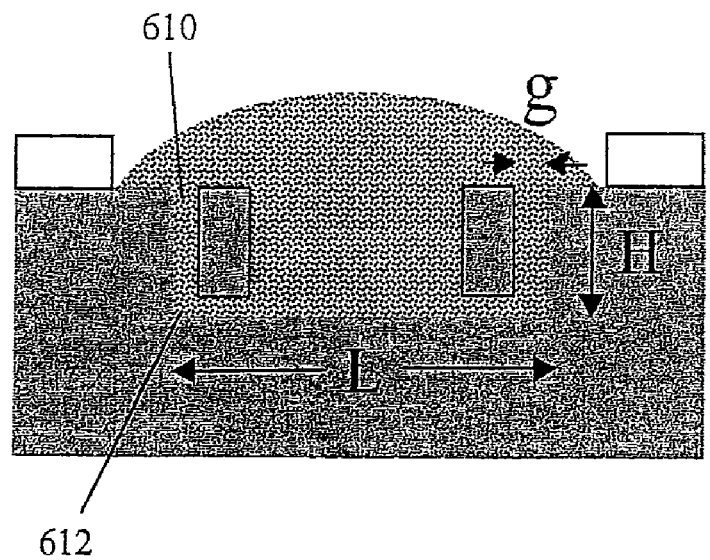
FIG. 7 is a diagram shown an embodiment of a MEMS device that is suited for the process of FIG. 6.

Alternatively, FIG. 6 describes a packaging via dispensing (PVD) approach for applying the thermally decomposable sacrificial layer. This approach is more suitable to package bulk micromachined structures (e.g., HARPSS gyros/accelerometers) with fragile elements and wide and deep cavities (e.g., L>>g, where L represents the length of an air cavity 710 and g represents the width of a hole 720), as represented by FIG. 7.

In this approach, thermally decomposable sacrificial material 610 (which does not have to be photo-definable) is applied (620) via a syringe dispensing tool (e.g., manually or automatically) with adjustable droplet size (e.g., 1 mm to 1 cm) to cover the air cavity 612. The sacrificial material 610 is then overcoated (630) using Avatrel overcoat material, and the process sequence continues similar to the PVP process, including a thermal release step (640) for decomposing the sacrificial layer 610 and a metallization step (650) for adding a metal barrier layer 617 over the air cavity 612. The final metallization step (650) enables a hermetically sealed package 618.

Figure 8:
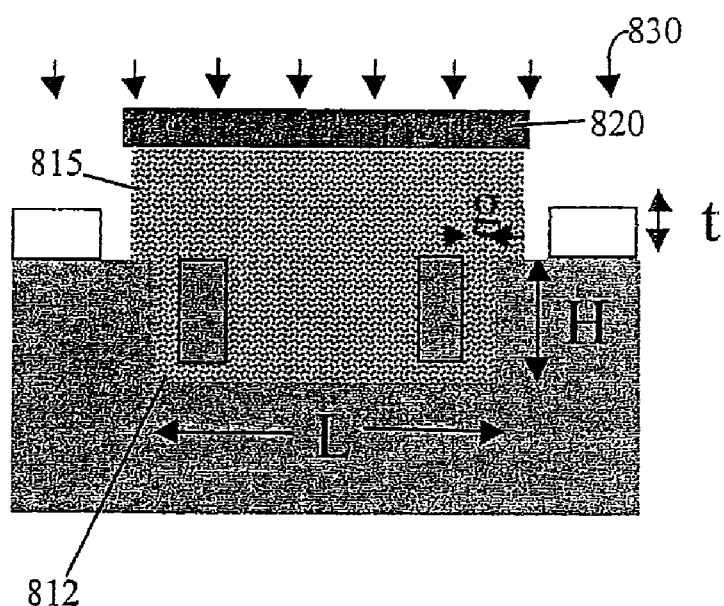
FIG. 8 is diagram. shown an embodiment of a MEMS device that is suited for an etching process for performing the process of applying a sacrificial layer as performed in FIG. 2.

The aforementioned processes are examples of techniques for applying a sacrificial material 325 and/or barrier materials 120 (e.g., overcoat materials, metal layers, other protective barriers, etc.) to MEMS devices. However, the present disclosure is not limited to the processes discussed with regard to FIGS. 4-7. For example, other lithography and etching techniques used in semiconductor fabrication processes may be used. As such, a MEMS device could also be packaged using a masked etching process on a thick sacrificial material which is aptly suited for packing small MEMS devices (e.g., HARPSS resonator, RF switch) with fragile elements or wide and deep holes (e.g., t>L>50 μm, where t represents the thickness of a sacrificial layer 810 and L is measures the length of an air cavity 820), as represented by FIG. 8. As such, an oxygen mask may be used to remove sacrificial material from undesired areas with an oxygen plasma.

Figure 9A:
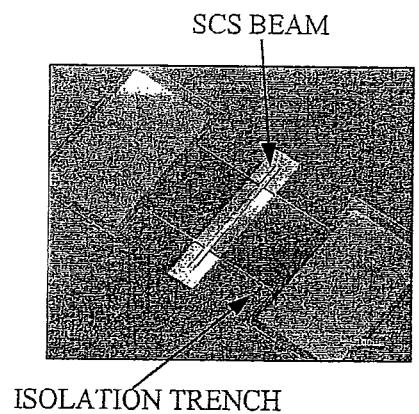
FIGS. 9A-9D are pictures illustrating a packaging process of FIG. 4 for a SOI beam resonator.
Figure 9B:
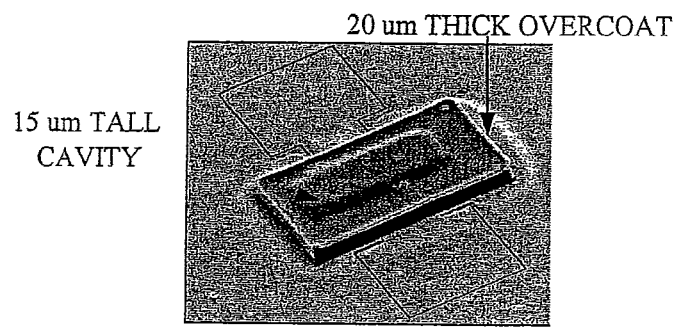

The feasibility of applying the aforementioned methods to package MEMS devices has been successfully verified. For example, a 15 μm thick 2.6 MHz SOI beam resonator (released) with 1 μm gap spacing, shown in FIG. 9A (with SCS beam and isolation trench noted), was packaged via PVP. Narrow trenches were etched down to the buried oxide to define the shape of the resonator and the sense/drive pads, followed by the removal of the buried oxide in HF solution. FIG. 9B shows the picture of the resonator after PVP. As shown, the resonator features a 15 μm tall cavity with a 20 μm thick overcoat layer.

Figure 9C:
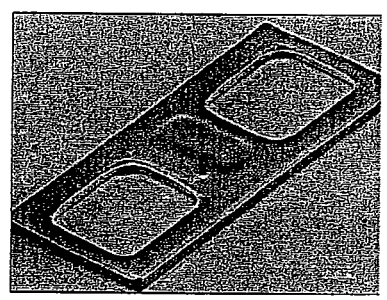
Figure 9D:
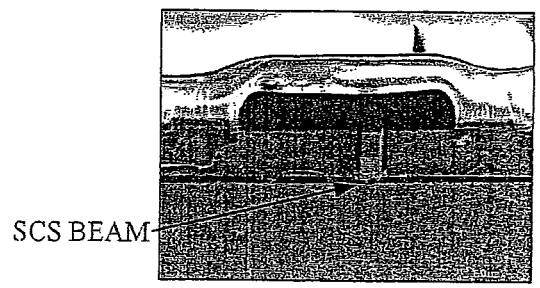

FIG. 9C shows the packaged resonator, after DC sputtering of gold to hermetically seal the device. In this device, the Avatrel overcoat was extended on top of isolation trenches. FIG. 9D shows the cross section of a broken packaged resonator (with SCS beam noted), showing a 15 μm tall, 80 μm wide cavity under a 20 μm thick Avatrel cap.

Figure 10A:
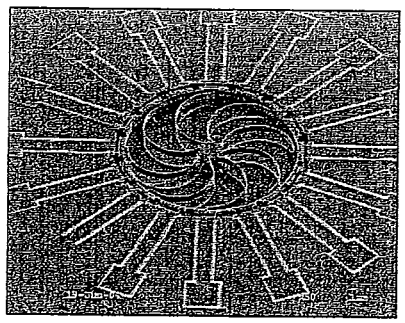
FIGS. 10A-10F are pictures illustrating a packaging process of FIG. 6 for a HARPSS Polysilicon ring gyrcoscope.
Figure 10B:
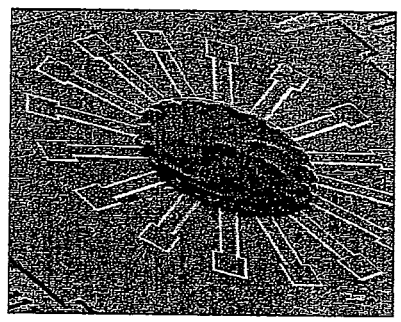
Figure 10C:
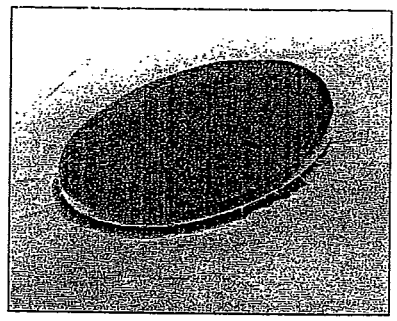
Figure 10D:
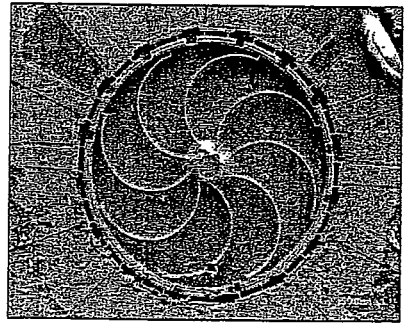

In order to evaluate the PVD method, a 50 μm thick polysilicon HARPSS ring gyroscope with 1 μm gap and 200 μm deep cavity was fabricated, as shown in FIG. 10A. HARPSS sequence starts with patterning the nitride anchors and defining the trench. A thin layer of sacrificial oxide is deposited to uniformly cover the trench sidewalls and define the capacitive gap in between the SCS and polysilicon electrodes. Trenches are refilled with doped polysilicon to form the ring, springs, and the electrodes. Finally, the sensor is released in a DRIE tool, followed by removing the sacrificial oxide in HF solution. FIG. 10B shows the same device after manual dispensing of the sacrificial material. FIG. 10C is the view of the device after forming a thick (120 μm) overcoat cap and decomposing the sacrificial material from inside the cavity. FIG. 10D shows the device after breaking the 2 mm wide Avatrel capsule, confirming a very clean cavity and intact device structure (device is free to vibrate).

Figure 10E:
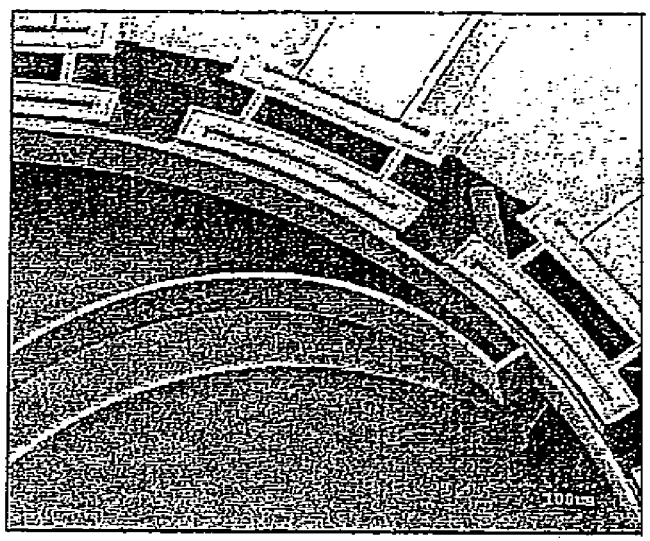
Figure 10F:
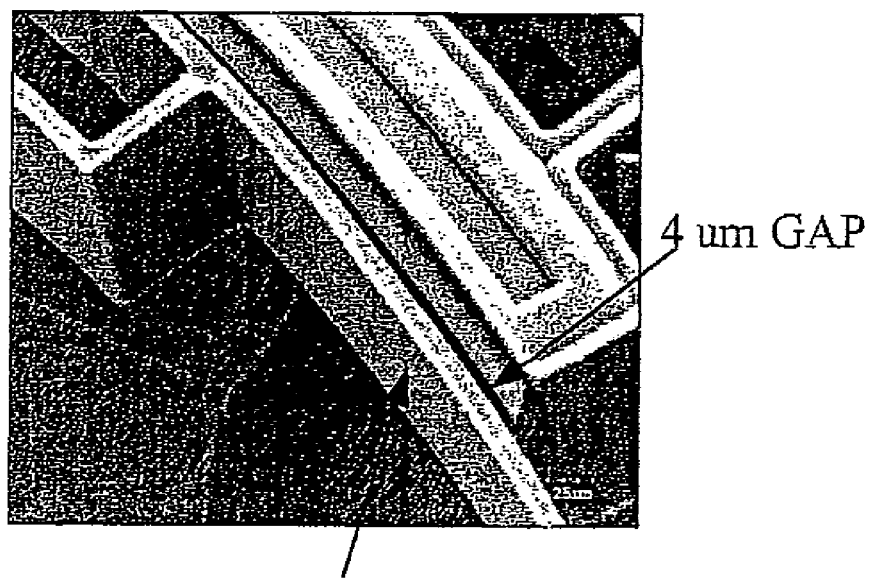

The close-up view of the electrodes, the 1 μm capacitive gap, and the 4 μm wide polysilicon ring and support springs are shown in FIGS. 10E and 10F. This clearly shows that the sacrificial material can be decomposed through a very thick overcoat to create a stiff cap. It takes a few hours in room temperature before the air molecules can outgas through the Avatrel cap inside a vacuum chamber and the structure can start to resonate with high Q-factor.

Figure 11A:
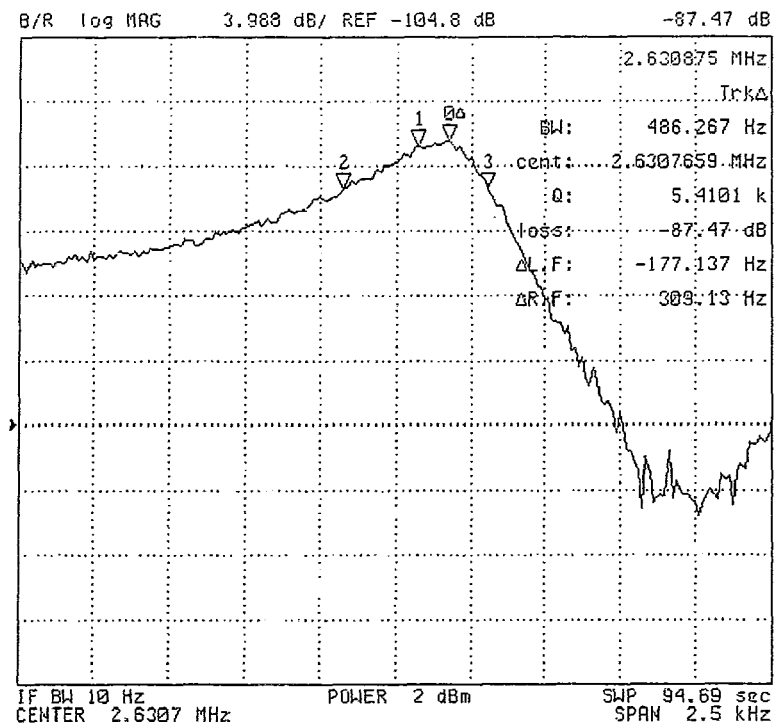
FIGS. 11A-11B are diagrams showing the frequency response of the SOI beam resonator of FIGS. 9A-9D before and after packaging.
Figure 11B:
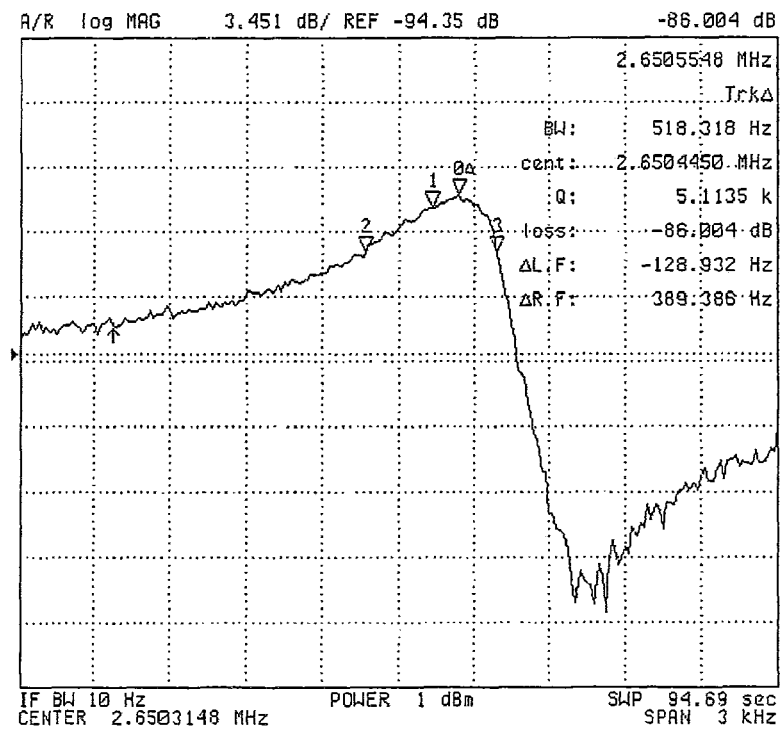

The packaged resonator of FIGS. 9A-9D was tested at wafer-level inside a vacuum probe station. A DC polarization voltage in the range of 70-80V was applied while the electrodes were directly connected to the network analyzer. FIG. 11A shows the frequency response of the resonator in vacuum before packaging and FIG. 11B shows the frequency response of the resonator in vacuum after packaging. The high Q-factor of approximately 5000 did not change for this device, proving that thermal decomposition of the Unity sacrificial material after packaging does not affect the performance of the device.

As previously mentioned, a variety of MEMS device packages may be fabricated with varying levels of protection against environmental elements. Accordingly, examples of embodiments of MEMS packages include, but are not limited to, the following.

Figure 12:
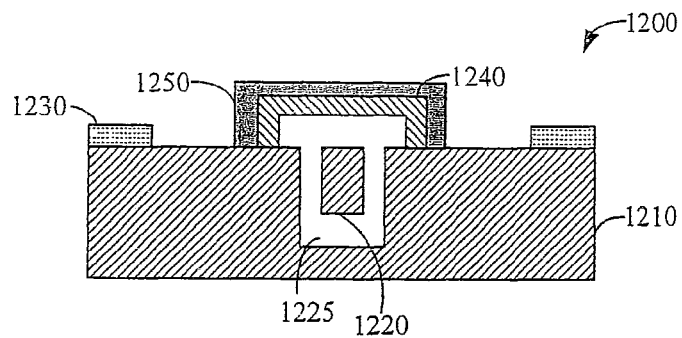
FIGS. 12-15 are diagrams showing different embodiments of a MEMS package that may be performed using portions of the process of FIG. 2.

In FIG. 12, one embodiment of a MEMS device package 1200 is shown In this embodiment, the MEFMS device package 1200 includes a substrate layer 1210, active region of MEMS device 1220, a vacuum packed air cavity region 1225, the contacts 1230, an overcoat layer 1240, and a barrier layer 1250. The package 1200 is fabricated by a process similar to that described with regard to the process of FIG. 2 where a sacrificial layer 325 has been removed to form the overcoat layer 1240 and barrier layer 1250 which may provide varying degrees of hermetic protection for the MEMS device. During this process, air inside the cavity 1225 was evacuated to produce a vacuum inside the cavity 1225, where the metal barrier 1250 prevents air from entering the air cavity region 1225.

By converting the sacrificial material 325 to a gaseous material that permeates the overcoat layer 1240, the cavity 1225 is free of residue, including any residual sacrificial material. Correspondingly, the overcoat layer 1240 is also free of residue and maintains structural integrity, since perforations were not drilled into the overcoat layer to remove any sacrificial material.

The MEMS package 1200 may be connected to external points or undergo further packaging by a variety of methods, including wirebond technology, flip-chip technologies, utilizing leadframe packaging, surface mount packaging, ceramic packaging, or other high performance techniques, as is described hereinafter. A particular processing technique available for a MEMS device may be dependent upon the level of protection offered by the overcoat and barrier layers, since different processing techniques exert different amounts of pressure and rigors on microelectronic devices.

Figure 13:
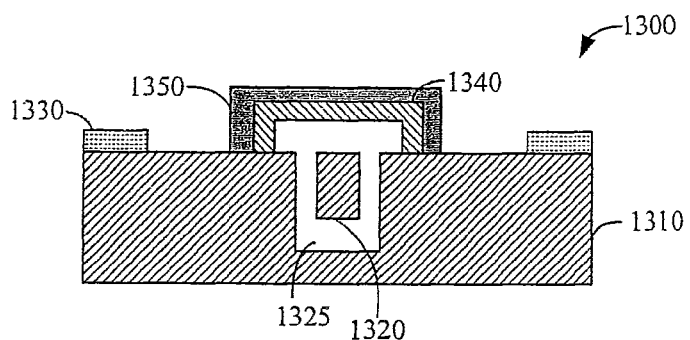

Referring now to FIG. 13, another embodiment of a MEMS package 1300 is shown. In FIG. 13, the MEMS device package 1300 includes a substrate layer 1310, active surface of a MEMS device 1320, an air cavity 1325 surrounding the active surface of the MEMS device, the contacts 1330, an overcoat layer 1340, and a barrier layer 1350. The package 1300 is fabricated by a process similar to that process described with regard to FIG. 2 where a sacrificial layer 325 has been removed to form the overcoat layer 1340 and barrier layer 1350. However, for this embodiment, the process of forming a vacuum inside the air cavity 1325 is not performed, since there are many MEMS devices that do not require vacuum packing. As such, the barrier layer 1350 may still prevent air and moisture from entering the air cavity region 1325 encapsulated by the barrier layer 1350 (e.g., a metal layer). Further, by converting the sacrificial material 325 to a gaseous material that permeates the overcoat layer 1340, the air cavity 1325 is free of residue, including any residual sacrificial material. Correspondingly, the overcoat layer 1340 is also free of residue and maintains structural integrity, since perforations were not drilled into the overcoat layer to remove any sacrificial material. The MEMS device package 1300 may be connected to external points by a variety of methods, including wirebond technology, flip-chip technologies, utilizing leadframe packaging, surface mount packaging, ceramic packaging, or other high performance techniques, as is described hereinafter. A particular processing technique available for a MEMS device may be dependent upon the level of protection offered by the overcoat and barrier layers, since different processing techniques exert different amounts of pressure and rigors on microelectronic devices.

Figure 14:
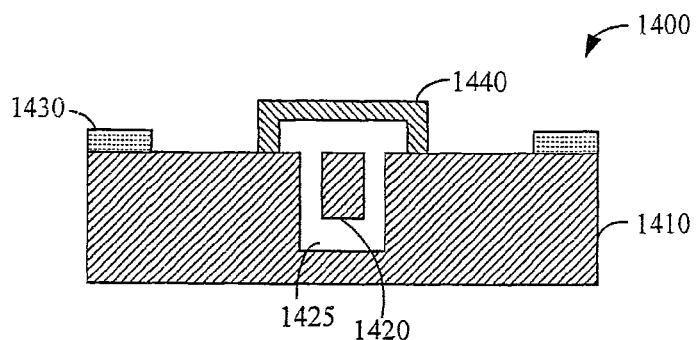

In another embodiment, FIG. 14 shows a MEMS device package 1400 with a substrate layer 1410, an active surface of MEMS device 1420, an air cavity region 1425 around the active surface of MEMS device, the contacts 1430, and an overcoat layer 1440 that also serves as a protective layer. This package 1400 is fabricated by a process similar to a portion of the process that is described with regard to FIG. 2 where a sacrificial layer 325 has been removed to form the overcoat layer 1440. However, in this example, the package 1400 is complete after the sacrificial layer 325 has been removed (230) and the overcoat layer 1440 remains.

Accordingly, as part of adding (220) the overcoat layer, the overcoat material is generally baked in order to make the overcoat rigid and hard, which may serve as adequate protection against external forces for many applications and types of MEMS devices. Moreover, by converting the sacrificial material 325 to a gaseous material that permeates the overcoat layer 1440, the air cavity 1425 is free of residue, including any residual sacrificial material. Correspondingly, the overcoat layer 1440 is also free of residue and maintains structural integrity, since perforations were not drilled into the overcoat layer to remove any sacrificial material. The MEMS device package 1400 may be connected to external points by a variety of methods, including wirebond technology, flip-chip technologies, utilizing leadframe packaging, surface mount packaging, ceramic packaging, or other high performance techniques, depending upon the particular qualities of the packaging processes and the protection requirements of particular MEMS devices.

Figure 15:
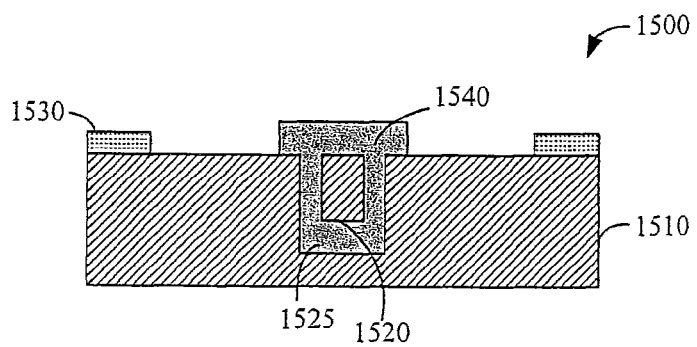

Referring now to FIG. 15, another embodiment of a MEMS device package 1500 is shown. In this embodiment, the MEMS device package 1500 includes a substrate layer 1510, an active surface of MEMS device 1520, an air cavity 1525 surrounding the active surface of the MEMS device, the contacts 1530, and a sacrificial layer 1540. The package 1500 is fabricated by a process similar to a portion of the process described with regard to FIG. 2 where a sacrificial material has been applied to form a sacrificial layer 325. However, in this particular example, the process is completed after the step of adding the sacrificial layer has been performed (210). Accordingly, as part of adding the sacrificial layer, the sacrificial material is encased around the active surface of a MEMS device 1520, which may serve as adequate protection against external forces before the MEMS device package is subsequently attached to external points or terminals by current wirebonding techniques and/or surface mounting practices.

After packaging of the MEMS device, the MEMS device package may not only resemble an integrated circuit (e.g., it has wire bond pads, a coated surface, etc.), but may also be treated like many integrated circuits and may be packaged like many integrated circuits. For example, consider the following process for attaching a MEMS device to a support structure, such as a metal frame traditionally used for mounting integrated circuits (e.g., leadframe).

Figure 16:
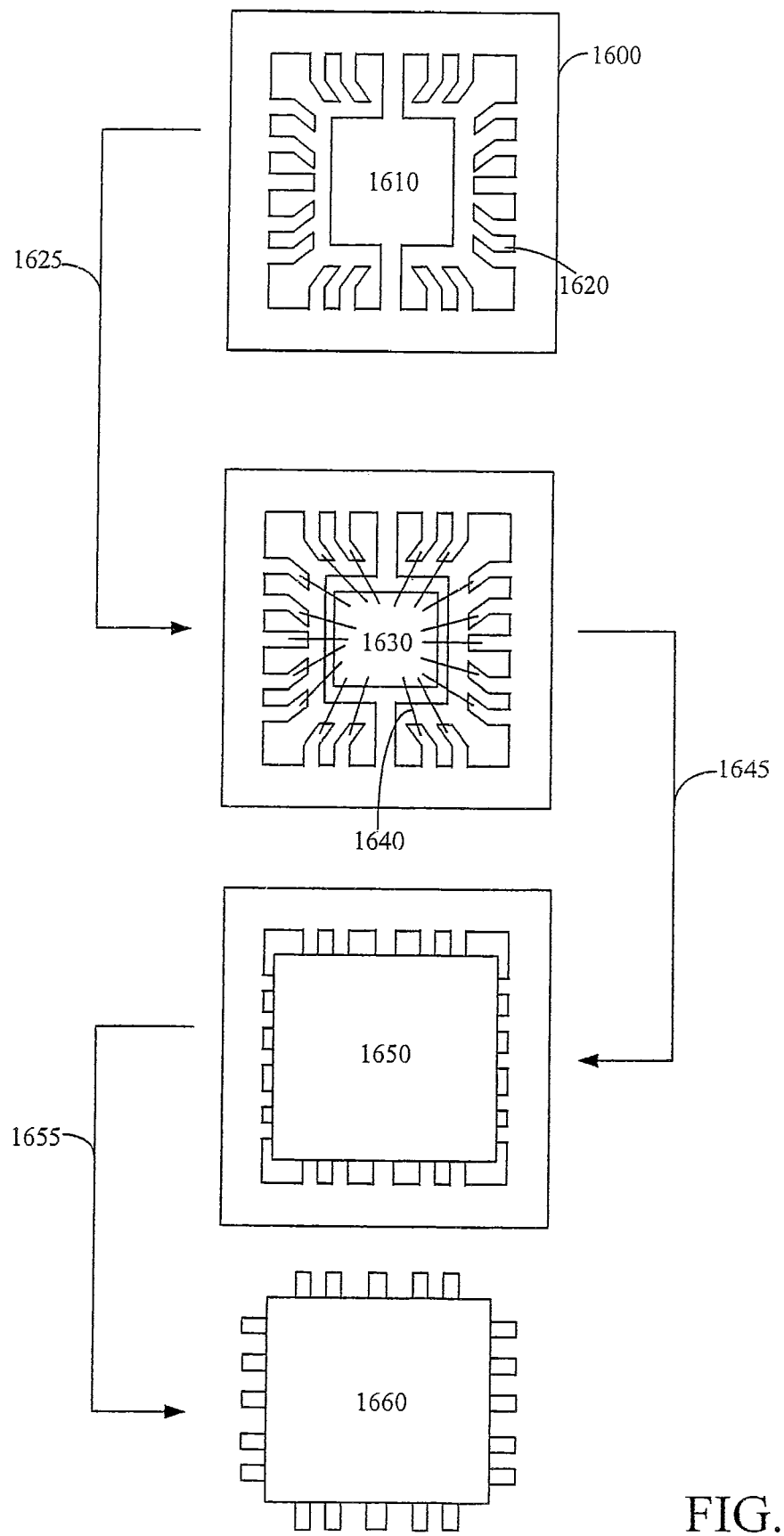
FIG. 16 is a diagram describing a fabrication process for attaching a MEMS device to a leadframe package, in accordance with the present disclosure.

As described in FIG. 16, a process for attaching a MEMS device 1500 having a sacrificial layer 1540 surrounding a MEMS device is discussed. Accordingly, a leadframe (1600) is provided. In this example, a thin metal sheet (e.g., Copper) is processed into a leadframe 1600 having a die pad 1610 for attaching a microelectronic device package and lead fingers 1620 for connecting wires to bond pads or contacts on the microelectronic device. Correspondingly, a MEMS device package 1630 having a sacrificial layer 1540 is attached (1625) to the leadframe 1600 (by mounting or bonding the package 1630 to the die pad 1610 of the leadframe 1600). Further, metal wires 1640 are connected (1625) from the lead fingers 1620 or terminals of the leadframe 1600 and the bond pads or contacts 130 of the MEMS device package 1630. Then, a coating material 1650 (e.g., plastic molding compounds, thermosetting polymers, epoxy resin, etc.) is applied (1645) to the surface of the MEMS device package and a portion of the leadframe 1600 as part of a molding process.

The coating material 1650 used in this process has a curing temperature that is lower than the temperature for thermal decomposition of the sacrificial material 1540 in the MEMS device package 1500. Thus, the coating material 1650 is cured at a lower temperature (that is less than the temperature for thermal decomposition of the sacrificial material) to harden the coating material. The coating material 1650 includes the characteristic of being permeable or semi-permeable to the decomposition gases produced by the decomposition of a sacrificial polymer of the sacrificial layer 1540.

The coating material 1650 serves to provide a moisture-resistive material over the surface of the MEMS device and lead frame assembly or "chip" for the purpose of minimizing package stresses on the surface of the chip and provide additional protection against corrosion. This is a standard step in low-cost microelectronic packaging of integrated circuits. However, with MEMS devices, such as step would typically negatively interfere and harm the workings of a MEMS structure that does not have a protective covering. Accordingly, with the presence of the sacrificial layer 1540, the coating 1650 is not in contact with the active surface of the MEMS device.

After the coating 1650 has cured and is hardened, the MEMS chip is then baked at a temperature that exceeds the thermal decomposition of the sacrificial material. After which, the sacrificial material is converted into a gaseous state and permeates or diffuses through the coating material 1650. After decomposition of the sacrificial layer, an air cavity is formed around the active surface of the MEMS device, and the coating material 1650 now serves as a protective layer to prohibit elements from entering the air cavity and to protect the MEMS device, in general. The MEMS "chip" 1660 is then removed (1655) from the leadframe via a singulation process and the leads of chip are bent into a desired shape, as part of standard chip packaging process.

A process, as just described, has worked well in thin epoxy packages (such as TSOP (thin small outline package) and TQFP (thin quad flat package). However, the process is not limited to thin epoxy coatings and may also work with other coating variants. Further, other embodiments of the MEMS device package may also be employed in a similar process.

For example, for one embodiment (as represented by FIG. 14), the MEMS device package includes an overcoat layer 1440 that provides additional support for the MEMS device without affecting the thermal decomposition of a sacrificial material 1425. Thus, such a MEMS device package may also be added to a leadframe using the process described in FIG. 16.

Additionally, in other embodiments (as represented by FIGS. 12 and 13), MEMS device packages may not include a sacrificial layer and alternatively, includes additional support structures, such as a barrier level 1250, 1350. As such, these MEMS device package will not need to baked at a temperature exceeding the curing temperature of the coating material, since a sacrificial material is not present. Otherwise, the process described in FIG. 16 may be used to further package such MEMS device packages using common integrated circuit packaging processes (e.g., leadframe packaging).

According to the present disclosure, some embodiments of the micro electro-mechanical device packages generally include one or more MEMS devices; interconnection from the device(s) to the package; a surrounding or containing structure to provide both mechanical and electrical, chemical, and environmental protection; and a joining structure to attach the package to a circuit board or system. Such embodiments provide a versatile packaging process at a wafer-level for MEMS devices that is generally applicable to package devices fabricated by different processes for various applications. Accordingly, embodiments of the present disclosure are capable of adapting to well-developed integrated circuit packaging technologies, as demonstrated in FIG. 17.

Figure 17:
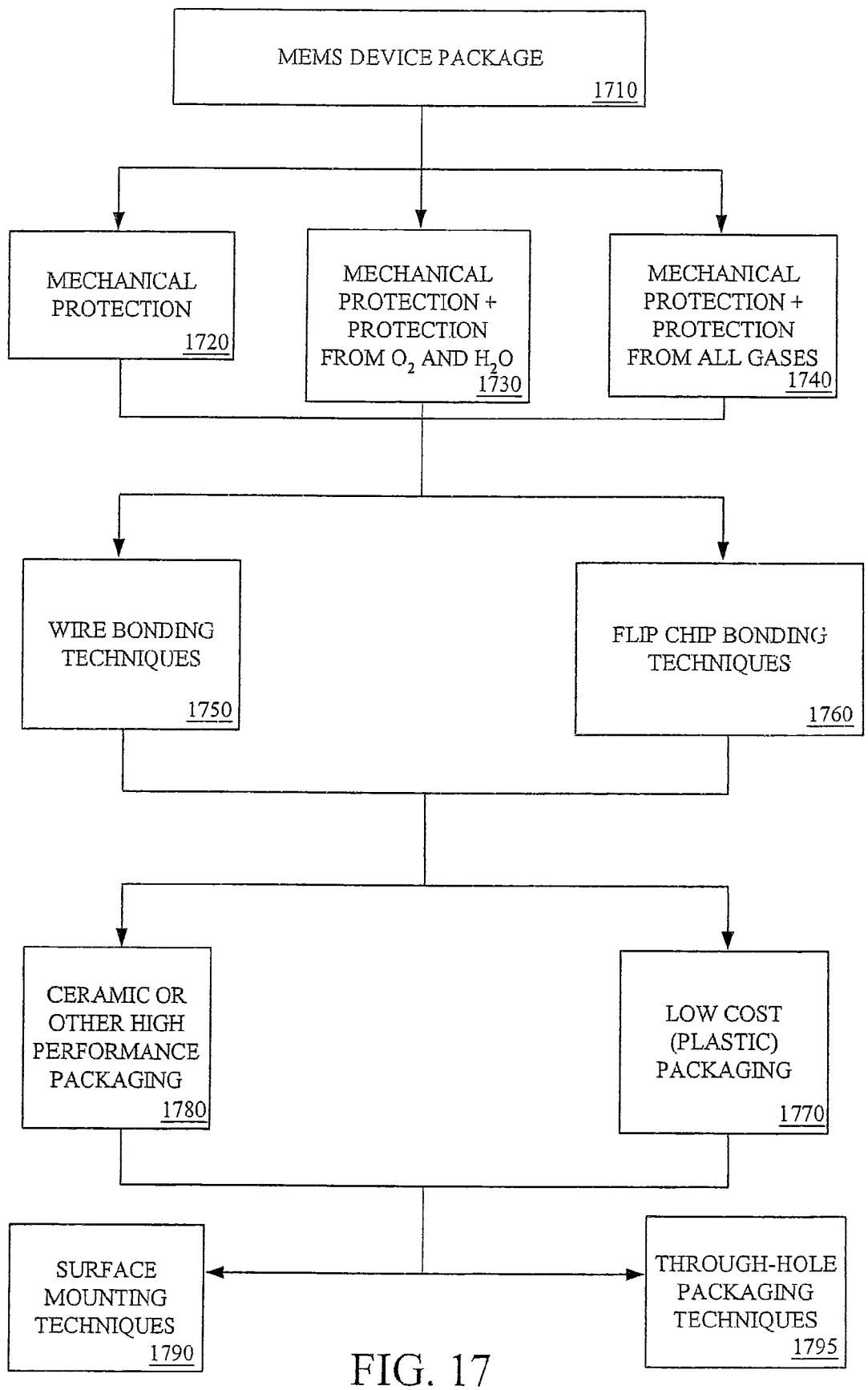
FIG. 17 is a diagram showing a variety of packaging technologies that can be employed with MEMS packages of the present disclosure.

Referring now to FIG. 17, a MEMS device package 1710 of the present disclosure can be produced to meet an assortment of packaging requirements and preferences. For example, a MEMS device package 1710 can be packaged to provide varying levels or degrees of hermetic protection for a MEMS device. As shown in FIG. 17, hermetic protection levels include, but is not limited to, mechanical protection 1720 (e.g., from inadvertent touching, further packaging, etc.), protection from oxygen and water in addition to mechanical protection 1730, and protection from all exposure to all gases (e.g., have a pure vacuum) in addition to mechanical protection 1740.

In addition to varying degrees of hermetic protection, a MEMS device package 1710 can also utilize a variety of bonding techniques to provide electrical connections to external points or terminals. Such bonding techniques include, but are not limited to, wire bonding techniques 1750 and flip chip bonding techniques 1760.

Moreover, a MEMS device package 1710 of the present disclosure can be further utilized in a variety of microelectronic device packaging techniques that are already in common use. For example, a MEMS device package may utilize common integrated circuit techniques that include, but are not limited, to low cost plastic packaging techniques 1770 and ceramic or other high performance packaging techniques 1780. For either of these approaches, additional packaging technologies are also available including, but not limited to, surface mount processes 1790 and through-hole mounting processes 1795.

Advantageously, embodiments of the present disclosure provide a variety of improved approaches for protecting MEMS devices. For example, in accordance with the present disclosure, a sacrificial layer on a MEMS device may be removed without perforating an overcoat layer surrounding the sacrificial layer and active structures of a MEMS device. Further, the thickness of the overcoat layer and/or barrier layer may be adjusted or tailored (e.g., between range of 50 nm and 500 µm) to withstand external pressures or pressures encountered during packaging processes and provide adequate protection for a MEMS device. For example, the overcoat layer can be spin-coated at a different speed or the viscosity of the overcoat material may be changed to adjust the thickness of the overcoat layer that is formed on a MEMS device. Therefore, the thickness of the overcoat material could be made as thick as reasonably necessary (e.g., 5 cm).

Advantageously, embodiments of the present disclosure may also provide a protective layer on any substrate material, since the sacrificial and overcoat materials are polymer substances and have good thermal mismatch characteristics with common substrate materials which does not result in deformations in MEMS structures. Additionally, there are a wide variety of sacrificial materials that can be employed in accordance with the present disclosure within a wide range of thermal decomposition temperatures. Thus, a desired thermal decomposition temperature can be selected (e.g., from 80° C. to 400° C.), and based upon the selected temperature, a sacrificial material can be chosen. Accordingly, decomposition time and temperature may be optimized for each application according to overcoat thickness. Further, sacrificial materials can be chosen based on whether a photosensitive sacrificial material is desired or not.

It should be emphasized that the above-described embodiments of the present disclosure are merely possible examples of implementations, merely set forth for a clear understanding of the principles of the disclosure. Many variations and modifications may be made to the above-described embodiment(s) of the disclosure without departing substantially from the spirit and principles of the disclosure. All such modifications and variations are intended to be included herein within the scope of this disclosure.

Therefore, the following is claimed:

1. A micro electro-mechanical device packaging system, comprising:
   a freestanding micro electro-mechanical structure formed on a substrate layer;
   a gas cavity enclosing said freestanding micro electro-mechanical structure; and
   a contiguous overcoat layer that is positioned on, and in direct contact with at least a portion of the substrate layer, said overcoat layer being distinct from the substrate layer, said overcoat layer protecting at least a portion of the micro electro-mechanical structure, and wherein the overcoat layer surrounds at least a portion of said gas cavity;
   where said contiguous overcoat layer comprises a modular polymer that includes the characteristic of being permeable to decomposition gases produced by thermal decomposition of a sacrificial polymer while forming the gas cavity.

2. The system of claim 1, where the substrate layer comprises silicon material.

3. The system of claim 1, where the substrate layer comprises non-silicon material.

4. The system of claim 1, further comprising a barrier layer around said overcoat layer, said barrier layer comprising a metal material.

5. The system of claim 4, where the metal material is deposited by sputtering.

6. The system of claim 1, where said overcoat layer comprises a polymer material.

7. The system of claim 6, where the polymer material is deposited by spin-coating.

8. The system of claim 6, further comprising:
   a barrier layer surrounding said overcoat layer.

9. The system of claim 8, where the barrier layer comprises a metal material.

10. The system of claim 1, where the gas cavity is substantially free of residue.

11. The system of claim 10, where the gas cavity is vacuum-packed.

12. The system of claim 1, where said overcoat layer has not been perforated before being applied onto the substrate layer.

13. The system of claim 12, further comprising:
   a metal packaging frame, the micro electro-mechanical device being attached to the metal packaging frame; and
   a coating material encapsulating a portion of the micro electro-mechanical device and metal packaging frame assembly.

14. The system of claim 1 where said overcoat layer is a solid.

15. A micro electro-mechanical device packaging system, comprising:
   a freestanding micro electro-mechanical structure formed on a substrate layer;
   a thermally decomposable sacrificial structure protecting at least a portion of the micro electro-mechanical device, wherein the sacrificial structure is formed into a gas cavity enclosing an active surface of the micro electro-mechanical device:
   a metal packaging frame, the micro electro-mechanical device being attached to the metal packaging frame: and
   a continuous overcoating layer that is positioned on, and in direct contact with at least a portion of the substrate layer, encapsulating a portion of said micro electro-mechanical structure and said metal packaging frame, said overcoating layer including the characteristic of being permeable to decomposition gases produced by the decomposition of said sacrificial structure at a temperature exceeding a curing temperature of said overcoating layer.

16. The system of claim 15, where said sacrificial structure comprises a photo-definable polycarbonate material.

17. The system of claim 15, where said sacrificial structure is deposited by spin-coating followed by patterning.

18. The system of claim 17, where said sacrificial structure comprises a photo-definable material.

19. The system of claim 15, where said sacrificial structure is dispensed by a syringe dispensing tool.

20. The system of claim 19, where said sacrificial structure comprises a non-photo-definable material.

21. The system of claim 15, further comprising:
   an integrated circuit package structure, the metal packaging frame being attached to the integrated circuit package.

22. The system of claim 21, where said overcoat layer comprises an epoxy resin.

23. The system of claim 21 where, said overcoat layer surrounds the thermally decomposable sacrificial structure, said overcoat layer comprising a modular polymer that includes the characteristic of being permeable to decomposition gases produced by the decomposition of the sacrificial polymer inside the gas cavity.

* * * * *